(12) United States Patent
Huang et al.

(10) Patent No.: US 6,963,214 B2
(45) Date of Patent: Nov. 8, 2005

(54) OBIRCH DUAL POWER CIRCUIT

(75) Inventors: Shun-Chi Huang, Hsin-Chu (TW); Chih-Ming Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/822,524

(22) Filed: Apr. 12, 2004

(65) Prior Publication Data

US 2005/0073328 A1 Apr. 7, 2005

Related U.S. Application Data

(60) Provisional application No. 60/509,101, filed on Oct. 6, 2003.

(51) Int. Cl.$^7$ .............................. G01R 31/26; G05F 3/02
(52) U.S. Cl. ....................................... 324/765; 327/535
(58) Field of Search ................................ 324/500, 537, 324/765, 158.1; 327/503, 504, 534, 535, 538; 307/28, 75, 1

(56) References Cited

U.S. PATENT DOCUMENTS

| | | | | |
|---|---|---|---|---|
| 5,015,889 A | * | 5/1991 | Reay | ............................ 326/90 |
| 5,708,371 A | | 1/1998 | Koyama | |
| 5,804,980 A | | 9/1998 | Nikawa | |
| 5,952,837 A | | 9/1999 | Koyama | |
| 6,028,435 A | | 2/2000 | Nikawa | |
| 6,066,956 A | | 5/2000 | Nikawa | |
| 6,078,183 A | | 6/2000 | Cole, Jr. | |
| 6,160,407 A | | 12/2000 | Nikawa | |
| 6,218,882 B1 | * | 4/2001 | Kamiya | ...................... 327/314 |
| 6,320,396 B1 | | 11/2001 | Nikawa | |
| 6,407,560 B1 | | 6/2002 | Walraven et al. | |

OTHER PUBLICATIONS

Takasu, Shinichi, "Application of OBIC/OBIRCH/OBHIC (Semiconductor Failure Analysis)," Application & Research Center, JEOL Ltd., www.jeol.com/jeol_news601/News%20home/60/, Jun. 27, 2003.

Nikawa, Kiyoshi, et al., "New Capabilities of OBIRCH Method for Fault Localization and Defect Detection," 5$^{th}$ Asian Test Symposium (ATS '97), Nov. 17–18, 1997, pp. 214–219, 1997 Institute of Electrical and Electronics Engineers, Inc., Akita, Japan.

* cited by examiner

Primary Examiner—Vinh Nguyen
Assistant Examiner—Russell M. Kobert
(74) Attorney, Agent, or Firm—Slater & Matsil, L.L.P.

(57) ABSTRACT

Methods and apparatus for testing a semiconductor structure requiring a precise core or operating voltage with an OBIRCH analysis arrangement. The separate power supply used for providing the precise core or operating voltage is eliminated, and is replaced by connecting a circuit comprised of a plurality of Schottky diodes connected in series across the constant voltage power supply used to provide the current for the OBIRCH analysis. A precise voltage is then tapped from an anode of the series connected Schottky diodes thereby significantly reducing effects of background noise on the OBIRCH analysis.

8 Claims, 2 Drawing Sheets

OBIRCH DUAL POWER CIRCUIT

This application claims the benefit of U.S. Provisional Application No. 60/509,101, filed on Oct. 6, 2003, entitled OBIRCH Dual Power Circuit, which application is hereby incorporated herein by reference.

TECHNICAL FIELD

The present invention relates generally to the testing of integrated circuits using the OBIRCH (Optical Beam Induced Resistance Change) techniques, and more particularly to the use of using the OBIRCH power supply to also power the integrated core circuits under test.

BACKGROUND

As is well known by those skilled in the art, a continuing goal in manufacturing and production of semiconductors is a reduction in size of components and circuits with the concurrent result of an increase in the number of circuits and/or circuit elements such as transistors, capacitors, etc., on a single semiconductor device. This relentless and successful reduction in size of the circuit elements has also required reduction in the size of the conductive lines, connecting devices and circuits. However, as the individual circuits and conducting lines are designed to be smaller and smaller, the number of circuits and connecting lines is increasing. This increase in numbers simultaneously raises the opportunity for more open circuits, more short circuits and other failures. The smaller size also increases the difficulty of identifying problem areas and/or failures such as short circuits and open circuits. As will be appreciated by those skilled in the art, these difficulties have led to the development of the OBIRCH testing techniques such as for example, described in Proceedings of the ATS (Asian Testing Symposium) 1997 Nov. 17, AKITA, pp. 214–219 (1997).

Aluminum is one of the materials commonly used as the metal interconnect lines and silicon oxide is commonly used as the dielectric. Deterioration of the reliability of aluminum interconnection lines has become more serious with the progressive miniaturization of semiconductor integrated circuits and increase in interconnection levels of semiconductor integrated circuits. Deterioration of the reliability of aluminum interconnection lines is attributable to increase in current stresses and mechanical stresses induced in aluminum interconnection lines.

While the size of aluminum interconnection lines is on the submicron order, currents that flow through aluminum interconnection lines are on the order of several hundred microamperes and current density is as high as the order of 105 A/cm2. Further, mechanical stresses are induced in interconnection lines when the semiconductor integrated circuit is subjected to heat treatment in the LSI manufacturing process.

Such stresses induced in the interconnection lines cause the migration of aluminum atoms, electromigration or stress migration, which forms voids in the interconnection lines. These voids increase the resistance of the interconnection lines and, in the worst case, break the interconnection lines.

However, newer manufacturing techniques now favor copper as the metal for interconnect lines and various low K materials (organic and inorganic) are favored as the dielectric material. Aluminum interconnects may be formed by depositing a layer of aluminum and then using photoresist, lithography, and etching to leave a desired pattern of aluminum lines, the formation of copper interconnect lines are typically formed by a process now commonly referred to as a Damascene process. The Damascene process is almost the reverse of etching, and simply stated a trench, canal or via is cut, etched or otherwise formed in the underlying dielectric and is then filled with metal (i.e., copper).

Unfortunately, although copper has the advantages discussed above, it readily diffuses into dielectric material used in the manufacture of semiconductor devices, and it diffuses especially easily into silicon dioxide. Diffusion of copper into the dielectric materials of a semiconductor device can cause serious reliability problems including electrical shorts. Therefore, it is typical to form a barrier layer between the copper used for conductors and leads and the dielectric material of a semiconductor device. Typical barrier layers may be formed of Ta (tantalum), TaN (tantalum nitride), Ti (titanium), TiN (titanium nitride) and various combinations of these metals as well as other metal. The barrier layer is typically formed on the bottom and sidewalls of the trenches and vias of the copper interconnects to prevent the copper from diffusing into the surrounding silicon dioxide as other dielectric material. A layer of silicon nitride is then typically deposited as a cover layer over the complete structure including the conductor areas and the dielectric layer before another layer or level of dielectric structure is deposited.

Accordingly, whether the integrated circuits (IC's) are fabricated using copper or aluminum interconnecting lines, the detection and observation of the frequency and positions of voids or shorts in the interconnecting lines, whether copper or aluminum, are essential to the reliability of integrated circuits.

Furthermore, as the size of the integrated circuits continues to decrease, the voltage levels for operating the individual elements has also decreased. Consequently, background noise and instability or drift of the power supplies used to test the circuits has a growing adverse effect on the ability to successfully test the IC's and to identify and locate the problems.

Therefore it would be advantageous to reduce the effects of background noise and power supply drift caused by the power supplies used during testing.

SUMMARY OF THE INVENTION

These and other problems are generally solved or circumvented, and technical advantages are generally achieved, by the present invention, which discloses methods and apparatus for reducing noise and power supply instability problems during OBIRCH analysis testing of circuit elements requiring a precise operating or core voltage. The invention comprising the steps of providing an OBIRCH analysis circuit having I/O terminals and having a circuit element to be tested connected thereto. A power source having a positive and a negative output is connected across the I/O terminals for providing a precise voltage to the OBIRCH analysis circuit. A diode circuit is also connected across the positive and negative outputs of the power source and includes a common or bi-polar diode having its anode connected to the positive output and its cathode connected to the anode of a plurality of Schottky diodes serially connected, cathode-to-anode. The negative output of the power source is connected to the cathode of the end Schottky diode of the plurality of serially connected diodes, such that a precise and different voltage selection is available at each Schottky diode of the series. One of the precise voltages at the anode of one of the Schottky diodes is then connected to a circuit element to be tested as its core or operating voltage and an OBIRCH circuit analysis is then run on the circuit element to be tested in the normal manner.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
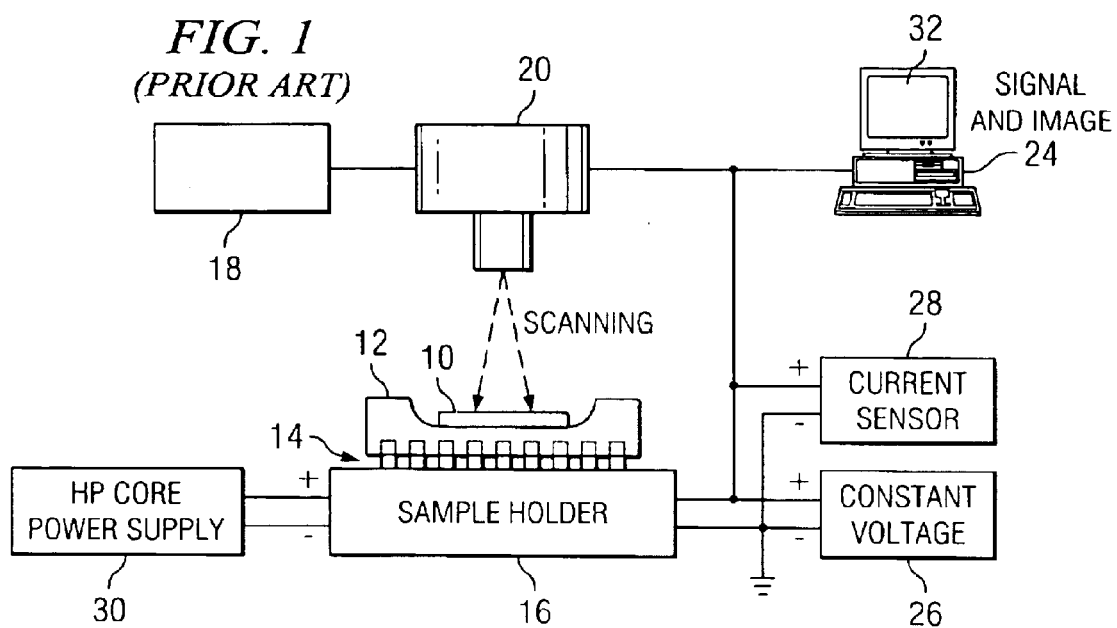
FIG. 1 is a prior art OBIRCH analysis setup using a first power supply to drive the OBIRCH circuitry and a second power supply to operate the circuit elements of the IC being tested.

Referring now to FIG. 1, there is shown a block diagram of the prior art apparatus for carrying out an OBIRCH method of analysis. As shown, an IC (integrated circuit) 10 is supported in a package 12 having a plurality of input/output contacts such as contact 14. In the embodiment illustrated, there is also included a test fixture 16 for ease of supporting and connecting the packaged IC chip 10 during testing.

A laser 18 together with a scanning microscope 20 is used to focus a laser beam onto elements of the chip 10 as it scans an area of the chip. The scanned area is determined by a signal on control line 22 provided by controller 24. Controller 24 also includes conversion circuitry to receive a signal indicating the precise position of the laser beam as its scans the chip 10. A constant voltage power supply 26 provides a current through the wires or conductors on chip 10 being measured, and a current sensing device 28 determines, measures and amplifies the current traveling through the selected wires and conductors on chip 10. Current sensing device 28 also sends a signal indication of the sensed current to controller 24.

Also according to the prior art, there is another power supply 30 such as a model 4155 from the Hewlett Packard Company for providing selected "core" or "operating" voltages to the active current elements on chip 10. The controller 24 then provides imaging information corresponding to the sensed current at each scanning position to the display 32. The provided information is typically luminescence information corresponding to the sensed current so that an image output of the chip provides an image indication of current flow through the wires and conductors at the various scan positions.

Although suitable for some testing, the prior art arrangement of FIG. 1 is not always satisfactory when testing portions of an IC with operating active elements such as transistors and the like. This unsatisfactory operation is typically due to background noise, drift and other forms of instability of the power supply 30 with respect to the constant voltage supply 26. This noise and instability swamps the current charges due to defects in the chip so as to make the current images unreliable.

Figure 2:
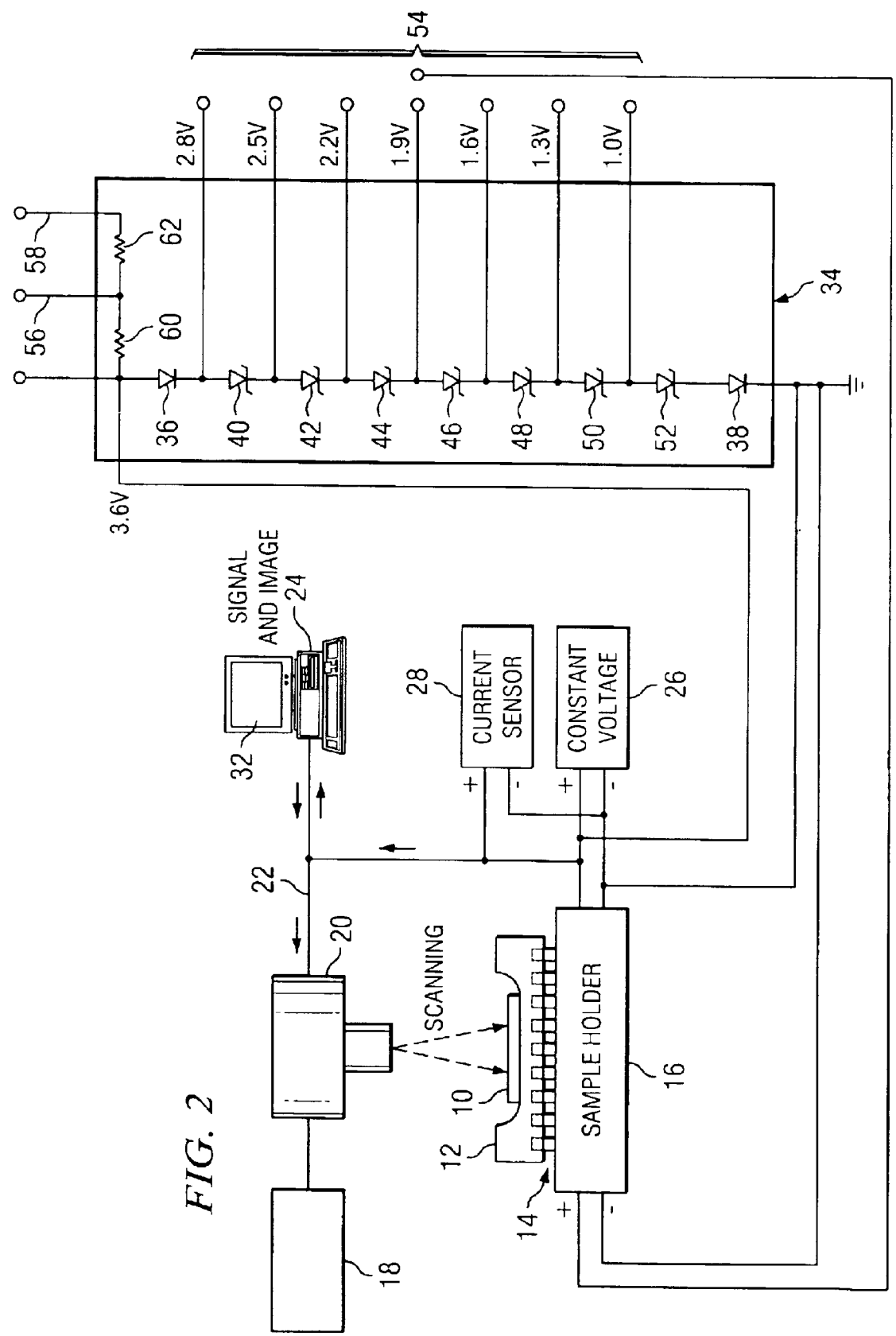
FIG. 2 is an OBIRCH setup according to the present invention for decreasing the effects of power supply background noise and instability by using a single constant voltage power supply and a Schottky diode circuit to power both the OBIRCH analysis circuit and the circuit element under test.

Referring now to FIG. 2, there is illustrated a new method of setting up an OBIRCH circuit analysis that overcomes these problems. Those portions of the circuit arrangement that operate similar to the prior art arrangement carry the same reference numbers used in FIG. 1. Therefore, as shown, and according to the present invention, the separate power supply 30 has been eliminated with the constant voltage power supply 26 in addition to being used as the current source for providing current through the wires and conductors of the chip 10 being tested, is now connected to a diode circuit 34, comprised of a pair of common or bipolar diodes 36 and 38 connected to a series of Schottky diodes 40–52. In the embodiment shown, each of the Schottky diodes 40–52, connected cathode-to-anode, are selected to provide a precise voltage drop so that along with the two bipolar diodes 36 and 38, the constant voltage from power supply 26 results in a series of variable voltages 54 at the anode of each of the Schottky diodes.

Figure 3:
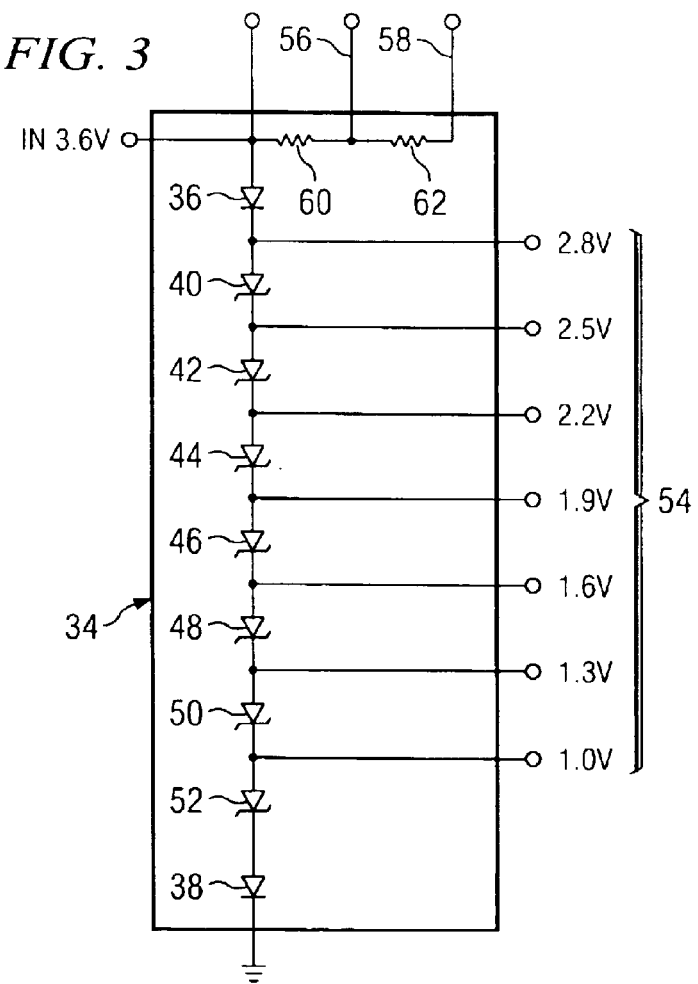
FIG. 3 is an enlarged view of the Schottky diode circuit of the present invention showing various voltages available for driving the IC elements under test.

As an example, the voltage output from constant voltage power supply 26 used to provide a constant current is typically about 3.6 volts, and seven Schottky diodes are all precisely selected to have a forward voltage drop of 0.3 volts each. These voltages, when combined with the forward voltage drop of the two common or bipolar diodes, provide a series of stable voltages available for use as the core or operating voltage of circuit elements on IC chip 10. Also as shown, output 56 and 58 provide additional voltage taps if needed. FIG. 3 is a more detailed illustration of the diode circuit 34.

Thus, by using constant voltage power supply 26, any background noise of the power supply 28 will be seen simultaneously at both the current source to the wires and conductors and to the core operating voltage provided to the individual elements on chip 10 so as to effectively cancel each other and provide a less distorted current image at display 32.

Although the present invention and its advantages have been described in detail, it should be understood that various changes, substitutions and alterations can be made herein without departing from the spirit and scope of the invention as defined by the appended claims. For example, it will be readily understood by those skilled in the art that dimensions and layer thickness may be varied while remaining within the scope of the present invention.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, methods, or steps.

What is claimed is:

1. A method of reducing noise and power supply instability problems during OBIRCH analysis testing of circuit elements requiring a precise operating or core voltage comprising the steps of:

providing an OBIRCH analysis circuit having I/O terminals;

connecting a circuit element to be tested to said OBIRCH analysis circuitry;

connecting a power source having a positive and a negative output across said I/O terminals for providing a known voltage to said OBIRCH analysis circuit;

connecting a diode circuit across said positive and negative outputs of said power source, said diode circuit comprising the steps of connecting the anode of a common or bi-polar diode to said positive output and connecting the cathode of said bi-polar diode to the anode of the first one of a plurality of Schottky diodes serially connected, cathode-to-anode, and coupling said negative output of said power source to the cathode end of said plurality of serially connected Schottky diodes, such that a precise and different voltage selection is available at the anode of each Schottky diode of said series;

connecting one of said precise voltage selections to said circuit element to be tested as its core or operating voltage; and running an OBIRCH circuit analysis on said circuit element to be tested.

2. The method of claim 1 wherein said diode circuit further comprises a second common or bi-polar diode having its anode connected at the cathode end of said plurality of serially connected Schottky diodes and with its cathode connected to the negative terminal of said power source.

3. The method of claim 1 wherein said step of connecting a power source comprises connecting a power source having an output voltage of approximately 3.6 volts.

4. The method of claim 3 wherein said step of connecting a plurality of Schottky diodes comprises the step of connecting seven Schottky diodes having a forward voltage drop of approximately 0.3 volts each.

5. Circuitry for reducing noise and power supply instability problems during OBIRCH analysis testing of circuit elements on an integrated circuit requiring a precise operating or core voltage comprising:

an OBIRCH analysis circuit having I/O terminals;

an integrated circuit to be tested connected to said OBIRCH analysis circuitry;

a power source having a positive and a negative output connected across said I/O terminals for providing a precise voltage to said OBIRCH analysis circuit;

a diode circuit connected across said positive and negative outputs of said power source, said diode circuit comprising a common or bi-polar diode having its anode connected to said positive output and its cathode connected to the anode of a plurality of Schottky diodes serially connected, cathode-to-anode, said negative output of said power source being coupled to the cathode of the end Schottky diode of said plurality of serially connected diodes, such that a precise and different voltage selection is available at the anode of each Schottky diode of said series; and said integrated circuit to be tested connected to one of said precise voltage selections as its core or operating voltage.

6. The circuitry of claim 5 further comprising a second common or bi-polar diode connected at the other end of said plurality of serially connected Schottky diodes and with its cathode connected to the negative terminal of said power source.

7. The circuitry of claim 5 wherein said power source has an output voltage of approximately 3.6 volts.

8. The circuitry of claim 7 wherein said plurality of serially connected Schottky diodes comprises seven serially connected diodes each having a forward voltage drop of approximately 0.3 volts each.

* * * * *